(12) United States Patent
Ohashi

(10) Patent No.: US 11,610,804 B2
(45) Date of Patent: Mar. 21, 2023

(54) SEMICONDUCTOR MANUFACTURING DEVICE

(71) Applicant: Kioxia Corporation, Minato-ku (JP)

(72) Inventor: Takashi Ohashi, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 298 days.

(21) Appl. No.: 16/927,514

(22) Filed: Jul. 13, 2020

(65) Prior Publication Data

US 2021/0074576 A1 Mar. 11, 2021

(30) Foreign Application Priority Data

Sep. 10, 2019 (JP) .............................. JP2019-164256

(51) Int. Cl.
- *H01L 21/687* (2006.01)
- *C23C 16/50* (2006.01)
- *C23C 16/458* (2006.01)
- *H01L 21/02* (2006.01)

(52) U.S. Cl.
CPC .... *H01L 21/68742* (2013.01); *C23C 16/4584* (2013.01); *C23C 16/50* (2013.01); *H01L 21/02274* (2013.01); *H01L 21/6875* (2013.01)

(58) Field of Classification Search
CPC ........... C23C 16/4584; H01L 21/68742; H01L 21/6875
See application file for complete search history.

(56) References Cited

U.S. PATENT DOCUMENTS

| | | | |
|---|---|---|---|
| 6,416,647 B1* | 7/2002 | Dordi | H01L 21/67051 204/278 |
| 2012/0309175 A1* | 12/2012 | Masumura | C23C 16/4585 257/E21.09 |
| 2016/0049323 A1 | 2/2016 | Ye et al. | |
| 2016/0099166 A1* | 4/2016 | Yudovsky | H01L 21/68764 269/21 |
| 2018/0211862 A1* | 7/2018 | Konkola | C23C 16/45544 |

FOREIGN PATENT DOCUMENTS

| | | |
|---|---|---|
| JP | 05-29224 A | 2/1993 |
| JP | 2004-128019 A | 4/2004 |
| JP | 2017-527115 A | 9/2017 |

* cited by examiner

*Primary Examiner* — Jaehwan Oh

(74) *Attorney, Agent, or Firm* — Oblon, McClelland, Maier & Neustadt, L.L.P.

(57) ABSTRACT

According to one embodiment, a semiconductor manufacturing device according to an embodiment of the present invention includes a chamber; and a stage, wherein the stage comprises: a holding member arranged in the chamber, the holding member having a plurality of convex parts on a surface for mounting a substrate; and a plurality of pins moving up and down in a vertical direction with respect to the holding member, the plurality of lift pins rotating around a rotating shaft parallel to the vertical direction, wherein the plurality of lift pins rotates the substrate around the rotating shaft.

17 Claims, 8 Drawing Sheets

SEMICONDUCTOR MANUFACTURING DEVICE

CROSS REFERENCES TO RELATED APPLICATION(S)

This application is based upon and claims the benefit of priority from the prior Japanese Patent Application No. 2019-164256, filed on Sep. 10, 2019, the entire contents of which are incorporated herein by reference.

FIELD

Embodiments described herein relate generally to a semiconductor manufacturing device.

BACKGROUND

In the process of manufacturing a semiconductor device, the film forming process using plasma technique is widely used. For example, chemical vapor deposition (PECVD) using the plasma technique is one of the vapor deposition method to form a thin film by converting source gas into plasma and depositing them on the substrate. The semiconductor device is formed by stacking a plurality of the patterned thin film on the substrate. Photolithography technique is generally used to form the pattern. However, if the thickness of the thin film during film formation is not uniform, the resolution of exposure is reduced because the focus does not be adjusted. Therefore, the uniformity of the film thickness during film formation greatly effects on the performance of the semiconductor device such as pattern refinement and densification.

Generally, plasma treatment is performed by holding the substrate on the holding member on which the substrate such as wafer is mounted, and generates plasma by applying direct current (DC), high frequency (RF), microwave, or the like to an upper electrode and a lower electrode. The raw material gas is converted into plasma by supplying raw material gas into this circumstance, and the film is deposited by chemical reaction at the surface of the substrate or vapor phase.

A convex part is formed on the mounting surface of the holding member for the substrate, electrodes are embedded to electrostatically hold the substrate through the convex part. By applying a voltage to the electrode, the Coulomb force (electrostatic force) is generated, so that the substrate can be fixed on the holding member and kept flat.

DESCRIPTION OF EMBODIMENTS

Figure 1A:
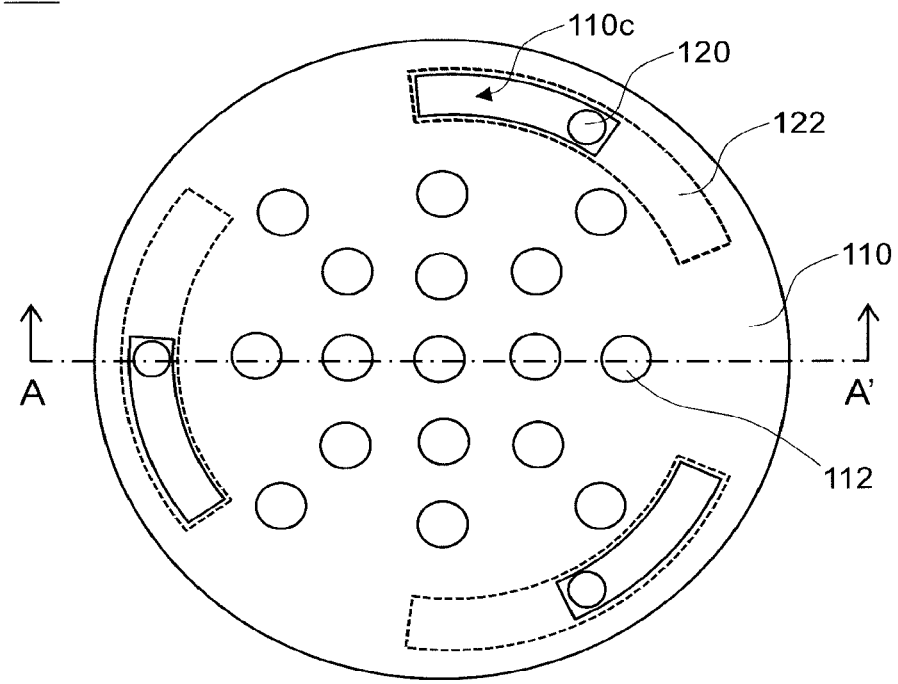
FIG. 1A and FIG. 1B are diagrams showing a configuration of a stage of a semiconductor manufacturing device according to one embodiment of the present invention.

A semiconductor manufacturing device according to one embodiment of the present invention including: a chamber; and a stage, wherein the stage includes: a holding member arranged inside the chamber, the holding member having a plurality of convex parts on a surface for mounting a substrate; and a plurality of lift pins moving up and down in a vertical direction with respect to the holding member, the plurality of lift pins rotating around a rotating shaft parallel to the vertical direction, wherein the plurality of lift pins move the substrate up and down on the holding member, and wherein the plurality of pins rotates the substrate around the rotating shaft.

Hereinafter, a semiconductor manufacturing device according to the present embodiment will be described in detail by referring to the drawings. In the following description, constituent elements having substantially the same functions and configurations are denoted by the same reference numerals, and duplicate description will be given only when necessary. Each of the embodiments described below exemplifies a device and a method for embodying the technical idea of this embodiment, and the technical idea of the embodiment does not specify the material, shape, structure, arrangement, and the like of the component parts as follows. Various modifications can be made to the technical idea of the embodiment in the claims.

In order to make the description clearer, the drawings may be schematically represented with respect to widths, thicknesses, shapes, and the like of the respective portions in comparison with actual embodiments, but are merely an example and do not limit the interpretation of the present invention. In the specification and each drawing, elements having the same functions as those described with reference to the preceding figures are denoted by the same reference numerals, and a repetitive description thereof may be omitted.

The semiconductor manufacturing device according to one embodiment of the present invention is typically a plasma processing device, for example, a plasma chemical vapor deposition device. The type of a thin film to be formed is not limited but is typically a silicon nitride film (SiN film), a silicon oxide film ($SiO_2$ film), amorphous silicon, carbon, or the like. Although the type of source gas used is not limited, silane ($SiH_4$), for example, is used for silicon film formation. If necessary, carrier gas such as hydrogen, nitrogen, helium, or argon is used. Depending on the type and quantity of the source gas, the type and quantity of the carrier gas, the exciting frequency of the plasma, the operating power, and the like, the structure and properties of the thin film to be deposited vary. In particular, the variation of a temperature of a substrate affects a thickness of the thin film to be deposited. Depending on the temperature distribution of the substrate, a thinner film is formed in a region where the substrate temperature is high, and a thicker film is formed in a region where the substrate temperature is low.

The distribution of the substrate temperature is controlled by a stage of the semiconductor manufacturing device.

[Configuration of a Stage of a Semiconductor Manufacturing Device]

Figure 1B:
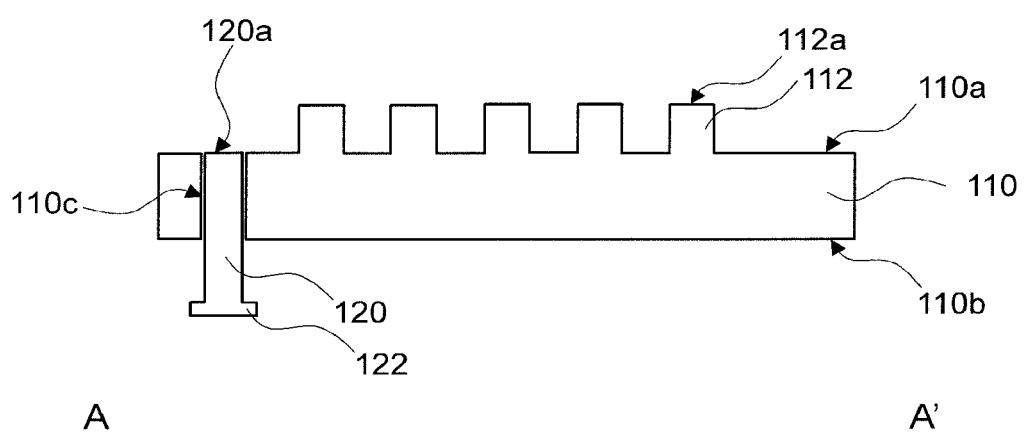

First, a configuration of a stage of a semiconductor manufacturing device according to one embodiment of the present invention will be described with reference to FIGS. 1A and 1B. FIG. 1A is a top view showing the configuration of the stage of the semiconductor manufacturing device according to the embodiment. FIG. 1B is an A-A' cross-sectional view showing the configuration of the stage of the semiconductor manufacturing device according to the embodiment.

As shown in FIGS. 1A and 1B, the stage 100 of the semiconductor manufacturing device according to the embodiment of the present invention comprises a holding member 110 and a lift pin 120.

The holding member 110 has a plurality of convex parts 112 on a surface (a first surface) 110a for mounting the substrate. In FIGS. 1A and 1B, the convex part 112 was shown in a cylindrical form. However, this embodiment is not limited thereto, and the convex part 112 may take any form. The convex part 112 has a contact surface 112a with the substrate. A plurality of contact surfaces 112a is arranged on the same horizontal surface at the same height. Therefore, the mounted substrate can be stably held horizontally. The number of the plurality of convex parts 112 is not particularly limited. The arrangement of the plurality of convex parts 112 will be described later.

A temperature control mechanism (not shown) is mounted in the stage 100. The temperature control mechanism allows the stage 100 to appropriately control a temperature of the substrate. For example, the holding member 110 may have a heating function and heat the substrate via the contact surface 112a of the convex part 112. For example, the holding member 110 may have a cooling function to introduce gas such as helium (He) into a space between the plurality of convex parts 112 to cool the substrate by thermal conduction of the gas.

The stage 100 may be, for example, electrostatic chuck (ESC). When the stage 100 is the electrostatic chuck, the convex part 112 of the holding member 110 may be embedded with an electrode (not shown) to electrostatically hold the substrate. However, this embodiment is not limited to this, and the holding member 110 only needs to be able to fix the mounted substrate in a desired position.

The holding member 110 has a plurality of openings 110c passes through from the surface 110a for mounting the substrate to a back surface 110b. In FIGS. 1A and 1B, the opening 110c has an arc shape. However, this embodiment is not limited to this, and the opening 110c may not interfere moving up and down and rotation of the lift pin 120 described later. The number of the openings 110c corresponds to the number of the lift pins 120.

The lift pin 120 is arranged inside the opening 110c. The lift pin 120 can be moved up and down to the vertical direction with respect to the holding member 110 by a drive mechanism (not shown) and can be rotated around a rotating shaft parallel to the vertical direction. The lift pin 120 has a contact surface 120a with the substrate. A plurality of contact surfaces 120a of the plurality of lift pins 120 are arranged on the same horizontal surface at the same height. In the present embodiment, the number of the lift pin 120 is three, but the number is not particularly limited. At least three of the lift pins 120 may be arranged and may be moved up and down and rotated in synchronization with each other. In the present embodiment, the plurality of lift pins 120 are arranged on a same circle. However, this embodiment is not limited thereto, and the plurality of lift pins 120 may be arranged on a concentric circle. With such configuration, the lift pins 120 can move the mounted substrate up and down and rotate around the rotating shaft on the holding member 110.

The lift pin 120 includes a cover member 122 having a surface parallel to the surface 110a for mounting the substrate. The cover member 122 is fixed to the respective lift pin 120 at the back surface (the second surface) 110b side of the substrate. The cover member 122 can be moved up and down and rotate with the lift pin 120. In FIGS. 1A and 1B, the cover member 122 is an arc shape. However, this embodiment is not limited to this, and the cover member 122 may overlap the plurality of openings 110c in a rotation range of the lift pin 120 in a planar view. That is, the cover member 122 only needs to be able to block the back surface 110b sides of the plurality of openings 110c within the rotation range of the lift pin 120.

The materials of the holding member 110 and the lift pin 120 are not particularly limited. As a material of the holding member 110, for example, quartz, carbon, or sapphire may be used. Quartz is more preferable as the material of the holding member 110. As a material of the lift pin 120, for example, sapphire, carbon, or quartz may be used. Sapphire is more preferable as the material of the lift pin 120.

[Operation of the Semiconductor Manufacturing Device]

With reference to FIGS. 2A to 7B, an operation of the semiconductor manufacturing device and a method of manufacturing the semiconductor device using the semiconductor manufacturing device according to the embodiment will be described. In the method of manufacturing the semiconductor device according to the present embodiment, the semiconductor manufacturing device rotates the substrate to form one thin film in two steps. However, this embodiment is not limited thereto, and in the method of manufacturing the semiconductor device according to the present embodiment, the semiconductor manufacturing device may rotate the substrate to form one thin film by dividing into a plurality of steps.

Figure 2A:
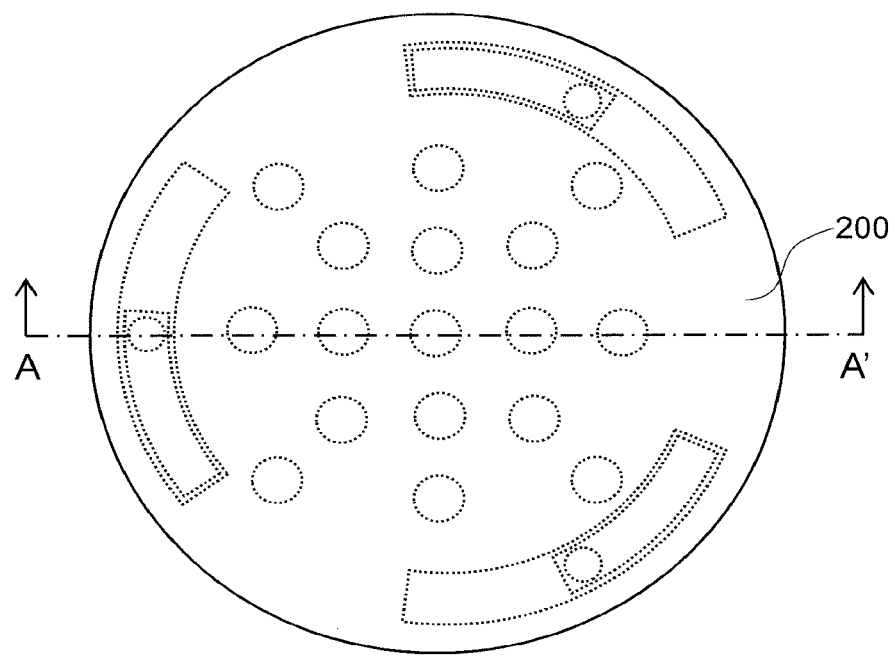
FIG. 2A and FIG. 2B are diagrams showing an operation of a semiconductor manufacturing device according to one embodiment of the present invention.
Figure 2B:
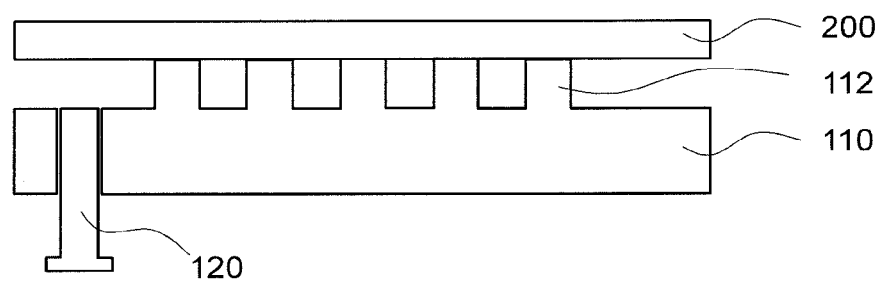

FIG. 2A shows a top view of the semiconductor manufacturing device with the substrate loaded. FIG. 2B shows A-A' cross-sectional view of the semiconductor manufacturing device with the substrate loaded. As shown in FIGS. 2A and 2B, a substrate 200 is mounted on the stage 100 of the semiconductor device. The substrate 200 contacts the contact surface 112a of the convex part 112 of the holding member 110. The holding member 110 can fix and keep the substrate 200 flat on the holding member 110 by attracting the substrate 200 through the convex part 112. Since the contact surface 112a of the convex part 112 is arranged on the same horizontal surface, the mounted substrate 200 can be stably held in a horizontal posture.

Figure 3A:
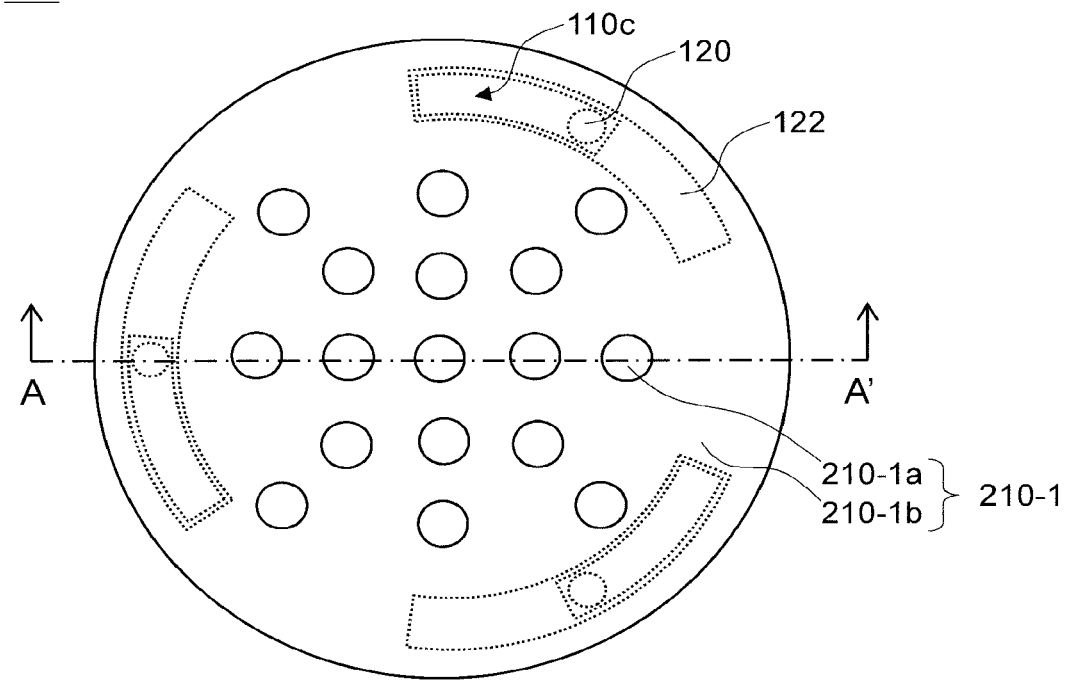
FIG. 3A and FIG. 3B are diagrams showing an operation of a semiconductor manufacturing device according to one embodiment of the present invention.
Figure 3B:
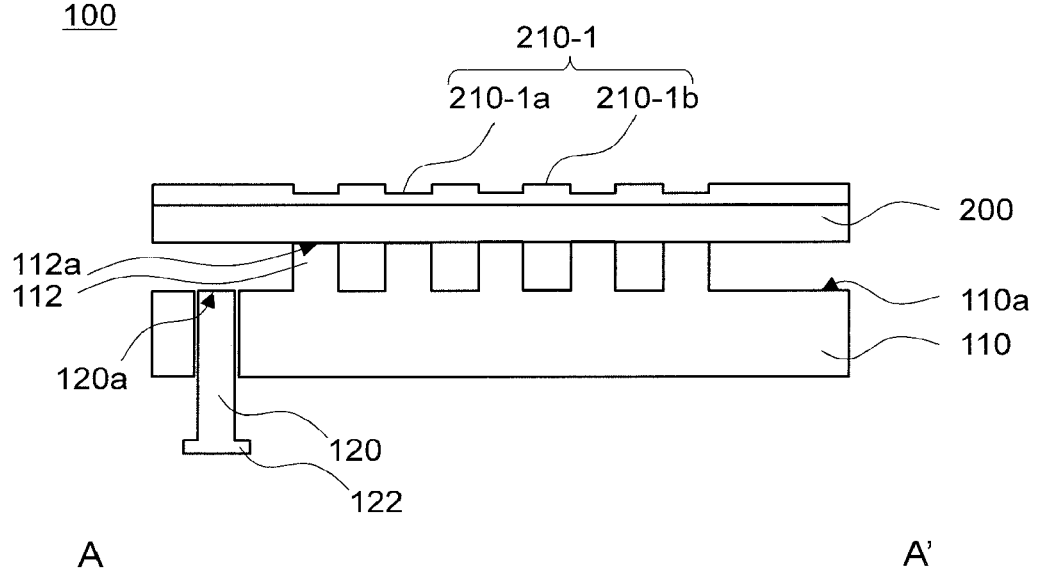

FIG. 3A is a top view of the semiconductor manufacturing device in a state of the first film formation on the substrate. FIG. 3B is a A-A' cross-sectional view of the semiconductor manufacturing device in a state of the first film formation on the substrate. As shown in FIG. 3A and FIG. 3B, a thin film 210-1 is formed on the substrate 200 fixed to the holding member 110. The temperature of the substrate 200 is controlled via the convex part 112 of the holding member 110. For this reason, a temperature of a region of the substrate 200 where the convex part 112 of the holding member 110 is in contact is high, and a temperature of a region of the substrate 200 where the convex part 112 of the holding member 110 is not in contact is low on the substrate 200. By forming such temperature distribution of the substrate 200, a thin film 210-1a having a smaller film thickness is formed in a region having a higher temperature, a thin film 210-1b having a larger film thickness is formed in a region having a lower temperature. (When the thin film 210-1a is not distinguished from the thin film 210-1b, it is referred to as the thin film 210-1.)

Here, the contact surface 120a with the substrate, which is the upper end of the lift pin 120, is arranged on the same surface as the surface 110a for mounting the substrate of the holding member 110. The back surface 110b side of the opening 110c is closed by the cover member 122 of the lift pin 120. With such configuration, abnormal discharges at the upper end portion of the lift pin 120 and the back surface through the opening 110c can be suppressed during the film formation.

Figure 4A:
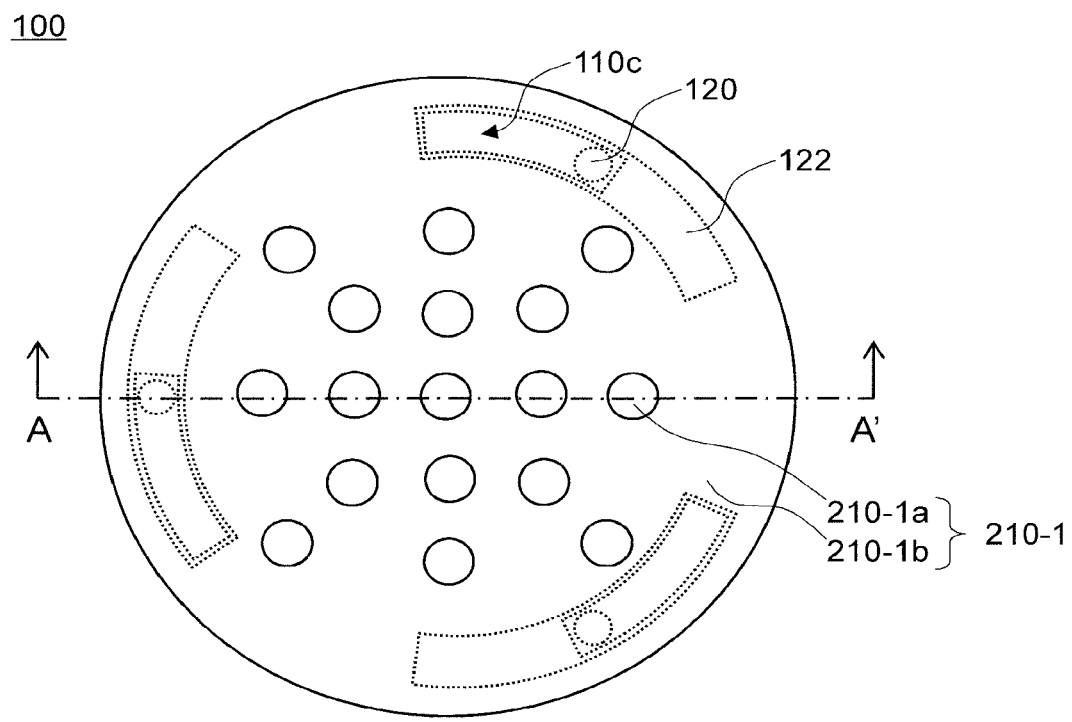
FIG. 4A and FIG. 4B are diagrams showing an operation of a semiconductor manufacturing device according to one embodiment of the present invention.
Figure 4B:
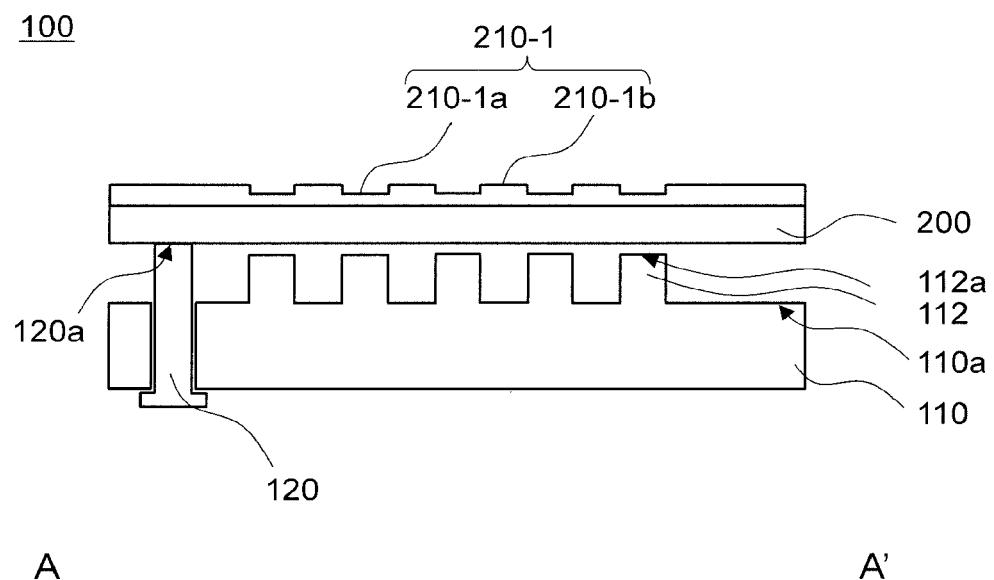

FIG. 4A shows a top view of the semiconductor manufacturing device with the substrate 200 raised. FIG. 4B shows a A-A' cross-sectional view of the semiconductor manufacturing device with the substrate 200 raised. As shown in FIGS. 4A and 4B, the plurality of lift pins 120 vertically rise from the surface 110a for mounting the substrate of the holding member 110 and came into contact with the substrate 200. The plurality of lift pins 120 further raises the substrate 200 to separate the contact surface 112a of the convex part 112 from the substrate 200. The substrate 200 is released from the attractive force of the holding member 110 and is lifted by the plurality of lift pins 120.

The contact surface 120a of the plurality of lift pins 120 with the substrate 200 rises in synchronization with each other. In the present embodiment, the three lift pins 120 are arranged on the same circle at intervals of 120°. However, this embodiment is not limited to this, and it is only necessary that three or more lift pins 120 are arranged on the concentric circle so that the substrate 200 can be stably raised. With this configuration, the plurality of lift pins 120 can stably lift the substrate 200 to the vertical direction in a horizontal posture.

Figure 5A:
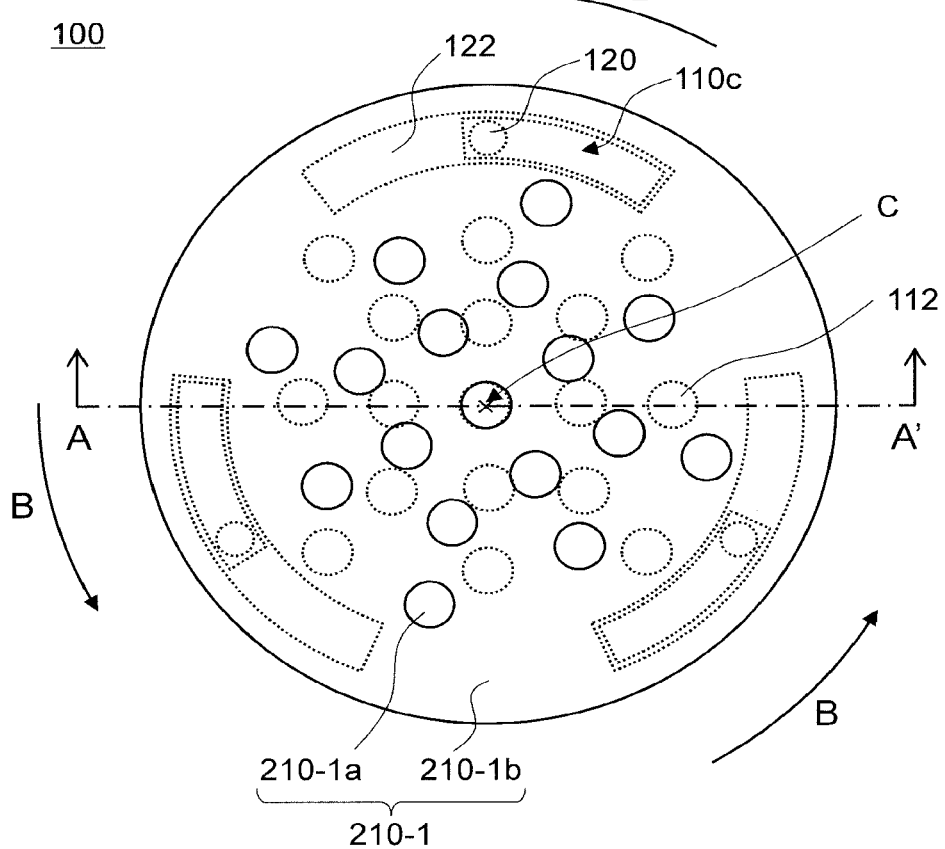
FIG. 5A and FIG. 5B are diagrams showing an operation of a semiconductor manufacturing device according to one embodiment of the present invention.
Figure 5B:
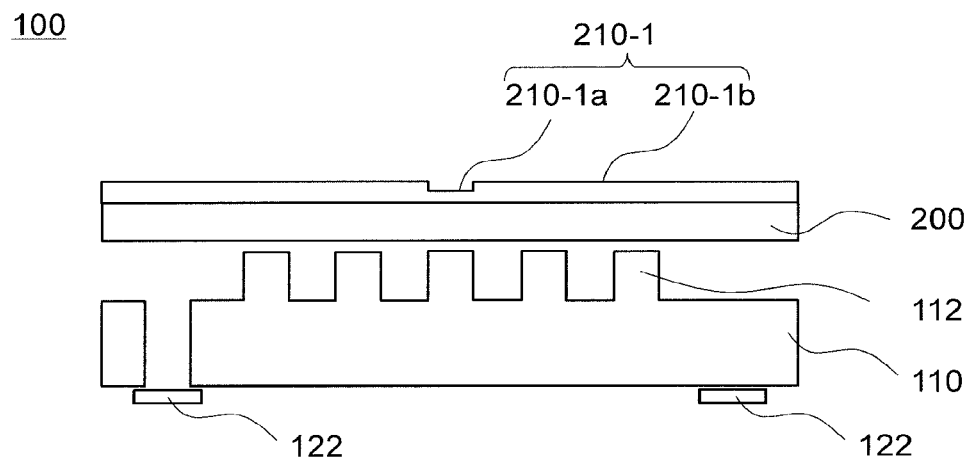

FIG. 5A is a top view of the semiconductor manufacturing device with the substrate 200 rotated. FIG. 5B is a A-A' cross-sectional view of the semiconductor manufacturing device when the substrate 200 is rotated. As shown in FIGS. 5A and 5B, the plurality of lift pins 120 rotates around a rotating shaft C that is parallel to the vertical direction in a counterclockwise B direction from one end of the opening 110c to the other end opposite to the one end. In the present embodiment, the rotating shaft C is arranged substantially at the center of the substrate 200. Therefore, the substrate 200 is rotated around the rotating shaft C. The plurality of lift pins 120 rotates in synchronization with each other. With this configuration, the plurality of lift pins 120 can stably rotate the substrate 200 in a horizontal posture.

The lowering of the plurality of lift pins 120 causes the substrate 200 to again mount on the holding member 110. Basically, the substrate 200 contacts the contact surface 112a of the convex part 112 of the holding member 110 at a region different from that in the first film formation. The holding member 110 can fix and keep the substrate 200 flat on the holding member 110 by attracting the substrate 200 through the convex part 112.

Figure 6A:
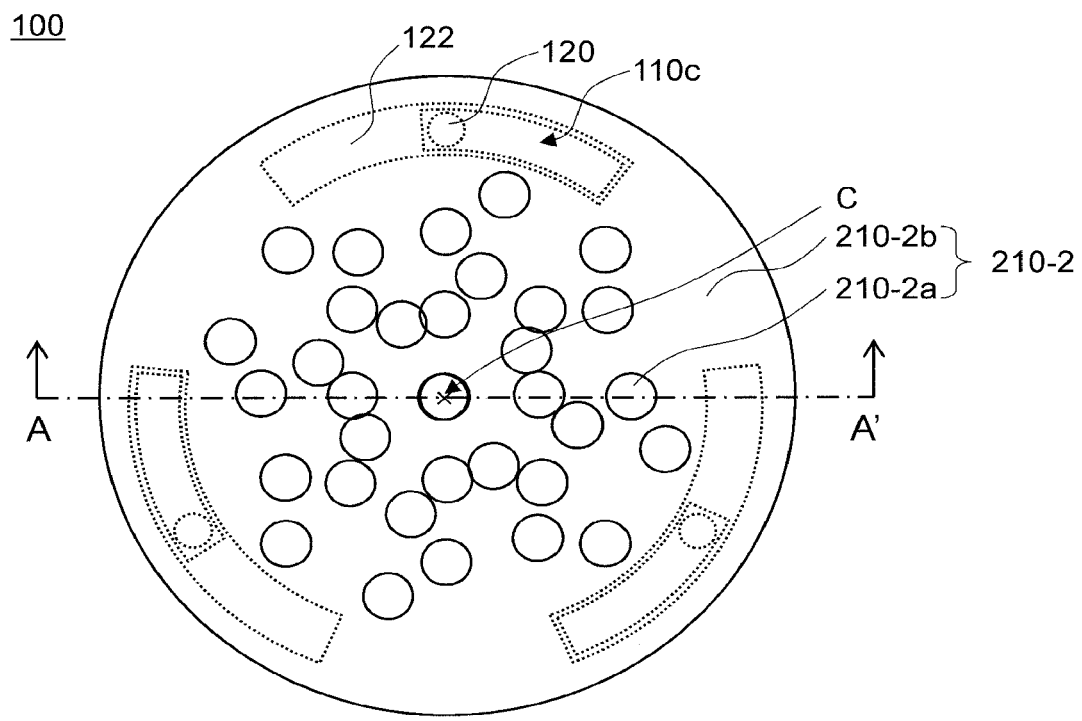
FIG. 6A and FIG. 6B are diagrams showing an operation of a semiconductor manufacturing device according to one embodiment of the present invention.
Figure 6B:
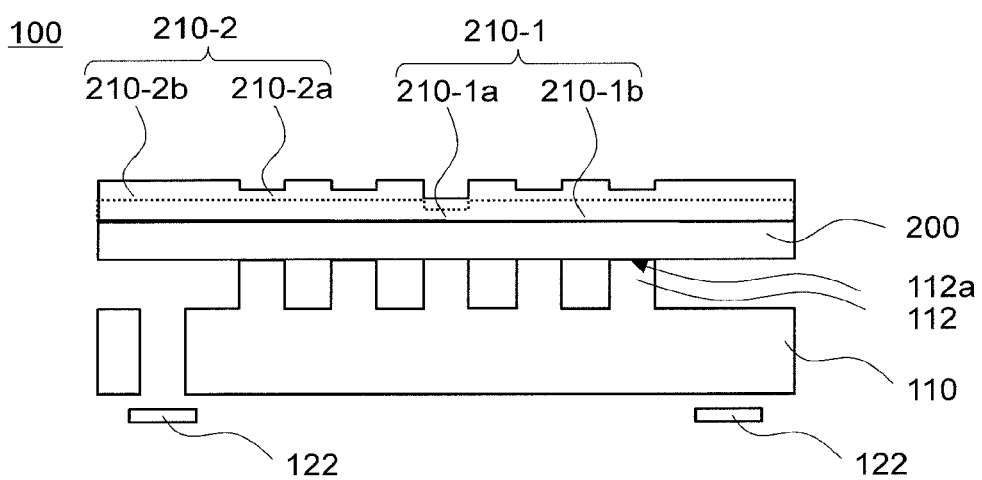

FIG. 6A is a top view of the semiconductor manufacturing device in a state of the second film formation on the substrate. FIG. 6B is a A-A' cross-sectional view of the semiconductor manufacturing device in a state of the second film formation on the substrate. As shown in FIGS. 6A and 6B, a thin film 210-2 is formed on the substrate 200 fixed to the holding member 110. At this time, the same materials are used for the first film formation of the thin film 210-1 and the second film formation of the thin film 210-2. The temperature of the substrate 200 is controlled via the convex part 112 of the holding member 110. Therefore, by forming the temperature distribution again on the substrate 200, a thin film 210-2a having a smaller film thickness is formed in a region having a higher temperature, a thin film 210-2b having a larger film thickness is formed in a region having a lower temperature. (When the thin film 210-2a is not distinguished from the thick thin film 210-2b, it is referred to as the thin film 210-2. When the thin film 210-1 is not distinguished from the thick thin film 210-2, it is referred to as the thin film 210.)

Since the substrate 200 basically contacts the contact surface 112a of the convex part 112 of the holding member 110 at a region different from that in the first film formation, the thin film 210-2b having a larger film thickness is formed on the thin film 210-1a having a smaller film thickness, and the thin film 210-2a having a smaller film thickness is formed on the thin film 210-1b having a larger film thickness. That is, the non-uniformity of the film thickness caused by the temperature distributions of the substrate 200 due to the contact of the holding member 110 can be improved by forming the film in a plurality of steps in contact with the holding member 110 at the different region. In this embodiment, the holding member 110 has the convex part 112 in the rotating shaft C. Therefore, in the rotating shaft C, the thin film 210-2a having a smaller film thickness is formed on the thin film 210-1a having a smaller film thickness.

Here, the contact surface 120a with the substrate, which is the upper end of the lift pin 120, is arranged on the same surface as the surface 110a for mounting the substrate of the holding member 110. The back surface 110b side of the opening 110c is closed by the cover member 122 even after the lift pin 120 rotates. With this configuration, abnormal discharges at the upper end portion of the lift pin 120 and the back surface through the opening 110c can be suppressed during the film formation.

Thin film 210 having improved thickness uniformity can be formed on the substrate 200 by the semiconductor manufacturing device and the method of manufacturing the semiconductor device using the semiconductor manufacturing device according to the present embodiment.

[Modified Example of the Semiconductor Manufacturing Device]

Figure 7A:
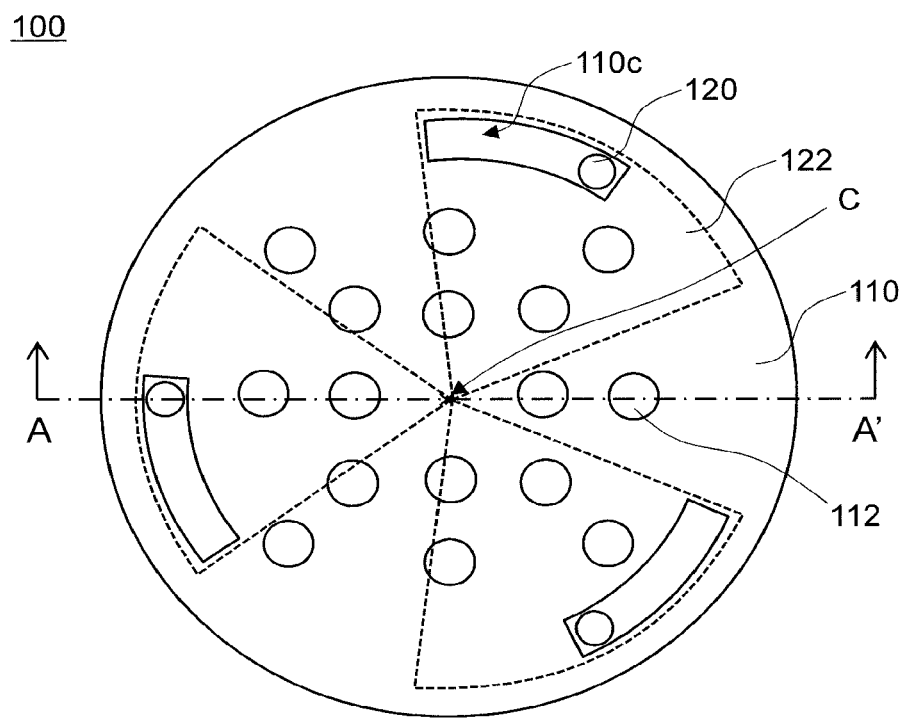
FIG. 7A and FIG. 7B are diagrams showing a configuration of a stage of a semiconductor manufacturing device according to one embodiment of the present invention.
Figure 7B:
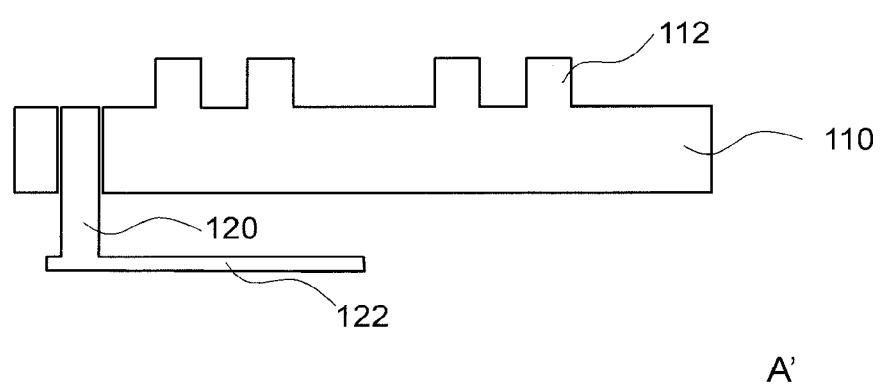

FIG. 7 is a diagram showing the configuration of the stage of the semiconductor manufacturing device according to a modified example. FIG. 7A is a top view showing the configuration of the stage of the semiconductor manufacturing device according to the modified example. FIG. 7B is a A-A' cross-sectional view showing the configuration of the stage of the semiconductor manufacturing device according to the modified example. In the modified example, since other than the arrangement of the plurality of convex parts 112 and the shape of the cover member 122 is the same as the embodiment, the repeated description be omitted.

The plurality of convex parts 112 is preferably arranged at a position where they do not overlap when they are rotated around the rotating shaft C. Therefore, in the present modified example, the plurality of convex parts 112 do not overlap with the rotating shaft C. Depending on the arrangement of the plurality of convex parts 112, the degree of rotation can be appropriately selected. For example, if the arrangement of the plurality of convex parts 112 is 20° rotational symmetry, film formation may be divided in two steps by rotating the substrate 200 10°. If the arrangement of the plurality of convex parts 112 is N° rotational symmetry, film formation may be divided in two steps by rotating the substrate 200 N/2°, or film formation may be divided in M steps by rotating the substrate 200 N/M° (N>M any one or more integer). With such configuration, a thin film having further improved thickness uniformity can be formed on the substrate.

In this modified example, the cover member 122 is fan shaped. By having such shape, the plurality of lift pins 120 can be moved up and down and rotated integrally via the cover member 122, the control of the operation (synchronization) is facilitated. However, the configuration of the cover member 122 is not limited to this and maybe overlapped with the plurality of opening 110c in the rotation range of the lift pin 120 in a planar view.

[Entire Configuration of the Semiconductor Manufacturing Device]

Figure 8:
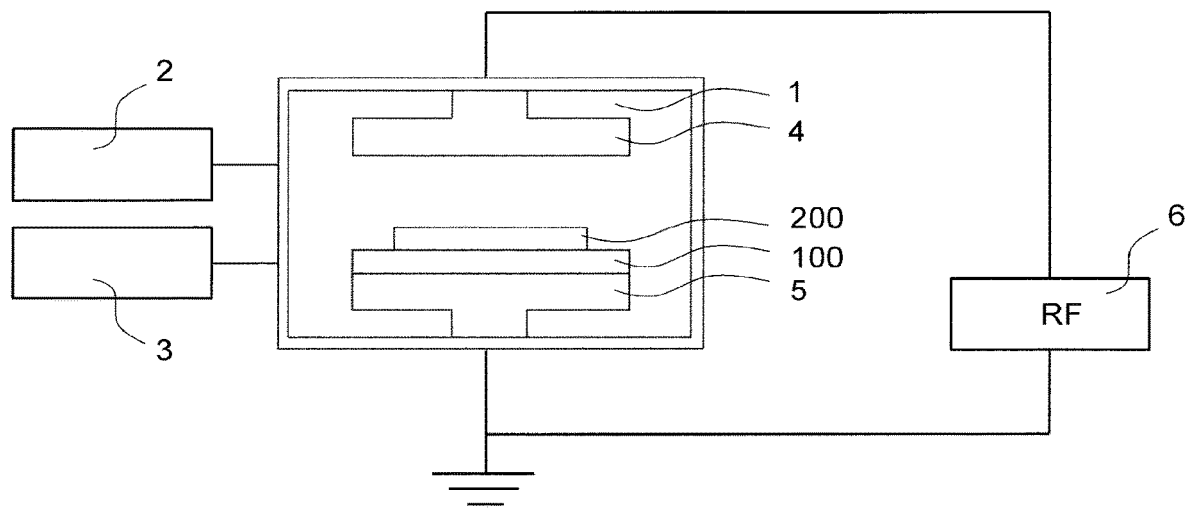
FIG. 8 is a diagram showing a configuration of a semiconductor manufacturing device according to one embodiment of the present invention.

FIG. 8 is a diagram showing an entire configuration of the semiconductor manufacturing device according to the embodiment. As shown in FIG. 8, the semiconductor manufacturing device 10 includes a processing unit (chamber) 1, the stage 100, electrodes 4, 5, a RF power source 6.

The processing unit 1 has a processing region for containing the substrate 200. The processing unit 1 includes a gas supply system 2 for supplying the raw material gas and the carrier gas to the processing region, and an exhaust system 3 for exhausting the gas from the processing region and controlling the pressure in the processing region. The processing region of the processing unit 1 has the stage 100 arranged therein. The stage 100 is configured to support and hold the substrate 200. The processing unit 1 further includes the electrodes 4, 5.

The RF power source 6 is connected to the electrode 4. The electrode 4 and the electrode 5 to be grounded form a capacitive plasma generator. The RF power source 6 provides RF-energy to the electrode 4 to generate capacitive plasma between the electrode 4 and the electrode 5. The electrode 5 provides a ground path for the RF power source 6.

The RF power source 6 may include a high frequency radio frequency (HFRF) power supply, such as a 13.56 MHz RF generator, and a low frequency radio frequency (LFRF) power supply, such as a 300 kHz RF generator, for example. LFRF power supply provides both low frequency generation and fixed match elements. HFRF power supply is designed for use with the fixed matches to regulate the power supplied to the loads and eliminate concerns regarding forward and reflected power.

With the above configuration, the semiconductor manufacturing device 10 rotates the substrate 200 and performs film formation in a plurality of steps, thereby the non-uniformity of the film thickness caused by the temperature distribution of the substrate 200 due to the contact of the holding member 110 can be improved.

In this specification, an example is shown in which the semiconductor manufacturing device 10 is, for example, a plasma-enhanced chemical vapor deposition device. However, this embodiment is not limited thereto, and the stage of the semiconductor manufacturing device according to the embodiment can be applied to any plasma process. For example, the non-uniformity of the film thickness caused by the temperature distribution of the substrate 200 due to the contact of the holding member 110 may also affect the etching and may be applied to a plasma dry etching device.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor manufacturing device comprising:
   a chamber; and
   a stage, wherein the stage comprises:
      a holding member arranged in the chamber, the holding member having a plurality of convex parts on a surface for mounting a substrate; and
      a plurality of lift pins configured to move up and down in a vertical direction with respect to the holding member, the plurality of lift pins configured to rotate around a rotating shaft parallel to the vertical direction, wherein the plurality of lift pins configured to move the substrate up and down on the holding member, and wherein the plurality of lift pins configured to rotate the substrate around the rotating shaft.

2. The semiconductor manufacturing device according to claim 1, wherein the plurality of lift pins is three or more, the plurality of lift pins are arranged on a concentric circle, and the plurality of lift pins are configured to vertically move and rotate in synchronization with each other.

3. The semiconductor manufacturing device according to claim 1, wherein the plurality of convex parts is arranged at a position not overlapping with each other when the plurality of convex parts is rotated around the rotating shaft.

4. The semiconductor manufacturing device according to claim 1, wherein a contact surface of the plurality of lift pins with the substrate moves down to the lower end of the mounting surface.

5. The semiconductor manufacturing device according to claim 1,
   wherein the holding member has a plurality of openings;
   wherein the plurality of lift pins has a rotation range, the plurality of lift pins respectively arranged inside the plurality of openings, each of the plurality of lift pins having a cover member covering the plurality of openings within the rotation range.

6. The semiconductor manufacturing device according to claim 5, wherein the cover member is fixed to the plurality of lift pins at an opposite side of the surface for mounting the substrate, the cover member moved and rotated with the plurality of pins.

7. The semiconductor manufacturing device according to claim 1, wherein the plurality of convex parts is arranged in N° rotational symmetry, and
   wherein each of the plurality of lift pins rotates N/2° (N is an integral number of 1 or more).

8. The semiconductor manufacturing device according to claim 2, wherein the plurality of convex parts is arranged at a position not overlapping with each other when the plurality of convex parts is rotated around the rotating shaft.

9. The semiconductor manufacturing device according to claim 2, wherein a contact surface of the plurality of lift pins with the substrate moves down to the lower end of the mounting surface.

10. The semiconductor manufacturing device according to claim 2,
   wherein the holding member has a plurality of openings;
   wherein the plurality of lift pins has a rotation range, the plurality of lift pins respectively arranged inside the plurality of openings, each of the plurality of lift pins having a cover member covering the plurality of openings within the rotation range.

11. The semiconductor manufacturing device according to claim 2, wherein the plurality of convex parts is arranged in N° rotational symmetry, and
   wherein each of the plurality of lift pins rotates N/2° (N is an integral number of 1 or more).

12. The semiconductor manufacturing device according to claim 3, wherein a contact surface of the plurality of lift pins with the substrate moves down to the lower end of the mounting surface.

13. The semiconductor manufacturing device according to claim 3,
   wherein the holding member has a plurality of openings;
   wherein the plurality of lift pins has a rotation range, the plurality of lift pins respectively arranged inside the plurality of openings, each of the plurality of lift pins having a cover member covering the plurality of openings within the rotation range.

14. The semiconductor manufacturing device according to claim 3, wherein the plurality of convex parts is arranged in N° rotational symmetry, and
   wherein each of the plurality of lift pins rotates N/2° (N is an integral number of 1 or more).

15. The semiconductor manufacturing device according to claim 4,
   wherein the holding member has a plurality of openings;
   wherein the plurality of lift pins has a rotation range, the plurality of lift pins respectively arranged inside the plurality of openings, each of the plurality of lift pins having a cover member covering the plurality of openings within the rotation range.

16. The semiconductor manufacturing device according to claim 4, wherein the plurality of convex parts is arranged in N° rotational symmetry, and
   wherein each of the plurality of lift pins rotates N/2° (N is an integral number of 1 or more).

17. The semiconductor manufacturing device according to claim 5, wherein the plurality of convex parts is arranged in N° rotational symmetry, and
   wherein each of the plurality of lift pins rotates N/2° (N is an integral number of 1 or more).

* * * * *